United States Patent
Alsmeier et al.

(10) Patent No.: US 6,521,493 B1
(45) Date of Patent: Feb. 18, 2003

(54) SEMICONDUCTOR DEVICE WITH STI SIDEWALL IMPLANT

(75) Inventors: Johann Alsmeier, Wappingers Falls, NY (US); Giuseppe LaRosa, Fishkill, NY (US); Joseph Lukaitis, Pleasant Valley, NY (US); Rajesh Rengarajan, Dresden (DE)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/574,891

(22) Filed: May 19, 2000

(51) Int. Cl.⁷ .......................................... H01L 21/8238
(52) U.S. Cl. ...................... 438/199; 438/200; 438/208; 438/222; 438/227
(58) Field of Search ................................ 438/227, 228, 438/199–208, 218, 219, 220, 221, 222, 223, 224, 225, 226

(56) References Cited

U.S. PATENT DOCUMENTS

| | | | |
|---|---|---|---|
| 4,918,027 A | | 4/1990 | Fuse et al. |
| 5,350,941 A | | 9/1994 | Madan |
| 5,795,801 A | * | 8/1998 | Lee ............................. 438/199 |
| 5,874,346 A | * | 2/1999 | Fulford, Jr. et al. ........ 438/433 |
| 5,882,964 A | * | 3/1999 | Schwalke .................... 438/227 |
| 5,933,722 A | * | 8/1999 | Hong .......................... 438/232 |
| 5,960,276 A | * | 9/1999 | Liaw et al. .................. 438/224 |
| 5,981,321 A | * | 11/1999 | Chao ........................... 438/199 |
| 6,051,459 A | * | 4/2000 | Gardner et al. ............. 438/231 |
| 6,143,599 A | * | 11/2000 | Kim et al. ................... 438/243 |
| 6,150,204 A | * | 11/2000 | Ahmad et al. .............. 438/199 |
| 6,214,675 B1 | * | 4/2001 | Cochran et al. ............ 438/275 |
| 6,228,726 B1 | * | 5/2001 | Liaw .......................... 438/294 |
| 6,245,639 B1 | * | 6/2001 | Tsai et al. ................... 438/424 |
| 6,297,102 B1 | * | 10/2001 | You et al. ................... 438/275 |
| 6,306,737 B1 | * | 10/2001 | Mehrad et al. ............. 438/524 |
| 6,355,533 B2 | * | 3/2002 | Lee ............................. 438/366 |
| 6,380,016 B2 | * | 4/2002 | Kohler ........................ 438/200 |
| 6,410,375 B1 | * | 6/2002 | Lee ............................. 438/199 |
| 6,410,378 B2 | * | 6/2002 | Gonzales .................... 438/217 |
| 6,413,826 B2 | * | 7/2002 | Kim ............................ 438/287 |

FOREIGN PATENT DOCUMENTS

| | | | | |
|---|---|---|---|---|
| JP | 406021398 A | * | 1/1994 | |
| JP | 406112419 A | * | 4/1994 | |
| JP | 406209080 A | * | 7/1994 | |
| JP | 406209081 A | * | 7/1994 | |

\* cited by examiner

Primary Examiner—Caridad Everhart
Assistant Examiner—Chuong Luu
(74) Attorney, Agent, or Firm—Connolly, Bove, Lodge & Hutz; Todd M. C. Li

(57) ABSTRACT

A semiconductor device and method of manufacturing the same are provided. A trench is formed in a semiconductor substrate. A thin oxide liner is preferably formed on surfaces of the trench. After formation of the oxide liner, first regions of the semiconductor substrate are masked, leaving second regions thereof exposed. N-type devices are to be formed in the first regions and p-type devices are to be formed in the second regions. N-type ions may then be implanted into sidewalls of the trenches in the second regions. The mask is stripped and formation of the semiconductor device may be carried out in a conventional manner. The n-type ions are preferably only implanted into sidewalls where PMOSFETs are formed.

24 Claims, 4 Drawing Sheets

SEMICONDUCTOR DEVICE WITH STI SIDEWALL IMPLANT

BACKGROUND OF THE INVENTION

Trench isolation has been used in the semiconductor industry to reduce circuit topography and better isolate adjacent semiconductor devices. In a typical process of forming shallow trench isolation (STI), a thermally oxidized film is formed on the surface of a shallow trench. The trench is then filled with a dielectric material, for example oxide. A high density plasma process typically deposits the oxide used to fill the trenches and forms isolations. The high density plasma process may create charge trapping along the trench sidewall edge. In addition, it can produce an increase in the hot carrier sensitivity of PMOSFET devices. The enhanced hot carrier sensitivity is due to increased trapping efficiency of electron injection into the STI edge during the hot carrier and can result in the activation of a parasitic edge parasitic PMOSFET device. Thus, there is a need to reduce the STI process induced hot carrier sensitivity in PMOS-FETs.

Additionally, a nitride liner is sometimes formed on the thermally oxidized film in the STI. The nitride liner has been shown to be a highly effective oxygen diffusion barrier. Thus, the nitride liner may be formed to prevent oxidation of a silicon sidewall of a collar region of a storage trench. Moreover, the nitride liner prevents dislocations in the active areas of devices.

However, use of the nitride liner can cause some problems. The nitride liner has been shown to be a source of charge trapping, which leads to unacceptable levels of junction leakage in support circuitry. The charge trapping is the result of electron injection into the nitride liner. Charge trapping occurs in the nitride liner mainly due to process induced plasma charging.

The presence of the nitride liner and the resulting increase in electron trapping enhances the hot carrier sensitivity of buried channel PMOSFETs. Many methods of handling charge trapping have been proposed for other types of devices. Most of the methods address the problem by reducing the charge trapped in the nitride liner to improve isolation. For example, U.S. Pat. No. 5,747,866 to Ho et al. describe a structure which limits charge trapping. Ho et al. describe a crystalline RTN nitride liner deposited at greater than 1050° C. to lower the density of trapping centers. However, no satisfactory solutions have been provided for improving hot carrier reliability.

Thus, there is a need for a semiconductor device and manufacturing process that addresses the issue of charge trapping and the degraded hot carrier reliability currently associated with known processes.

SUMMARY OF THE INVENTION

A semiconductor device and method of manufacturing the same are provided. A trench is formed in a semiconductor substrate. A thin oxide liner is preferably formed on surfaces of the trench. After formation of the oxide liner, first regions of the semiconductor substrate are masked, leaving second regions thereof exposed. N-type devices are to be formed in the first regions and p-type devices are to be formed in the second regions. N-type ions may then be implanted into sidewalls of the trenches in the second regions. The mask is stripped and formation of the semiconductor device may be carried out in a conventional manner. The n-type ions are preferably only implanted into sidewalls where PMOSFETs are formed.

DESCRIPTION OF THE DRAWINGS

The present invention will now be further described in the following pages of specification when taken in conjunction with the attached drawings, in which.

DETAILED DESCRIPTION OF THE INVENTION

Figure 1A:
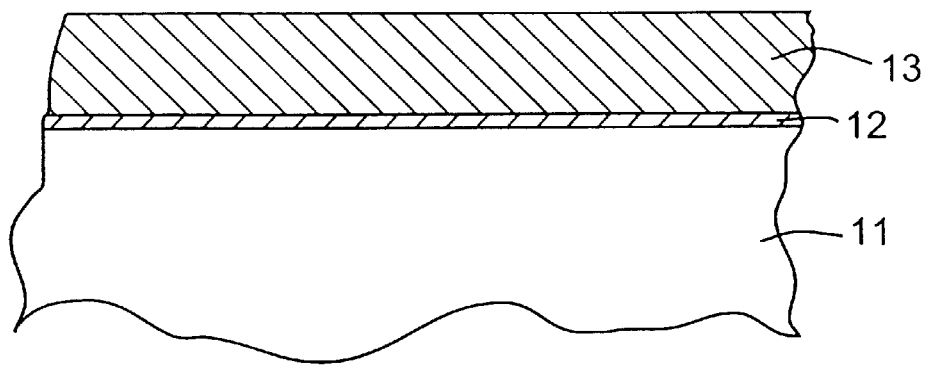
FIG. 1A is a cross-section of a semiconductor wafer explaining a process according to an embodiment of the invention.

The present invention provides a method of forming semiconductor devices with improved hot carrier reliability. Ions are implanted into sidewalls of trenches. The implanted ions form a doped layer that prevents electron injection into the trench. The invention can be used in any situation where NMOSFETs and PMOSETs are formed, for example in any CMOS application. In these instances, the ions are implanted into the STI sidewall in areas where PMOSFETs are formed in order to improve hot carrier reliability.

The invention is preferably implemented in the context of a DRAM array NMOSFET and will be describe below in this context. However, as mentioned above, the invention may also be used in connection with the formation of many other semiconductor devices. Typically, a DRAM array NMOSFET includes NMOSFET array devices formed in a p-well and NMOSFET and PMOSFET support devices formed in support regions. The NMOSFETs and PMOSFETs are usually formed in array and support regions on the same semiconductor substrate. STI is used to isolate the various array regions and support regions of the semiconductor substrate and the semiconductor devices formed thereon from one another. As discussed above, the STI usually includes a nitride liner formed in the trench and a high density plasma oxide filling the trench. Electron injection into trench sidewalls during the hot carrier stresses results into a degradation on PMOSFETs used as support circuitry in the DRAM.

The present invention reduces or prevents this degradation of hot carrier reliability by implanting n-type dopants into the PMOSFET active area (AA) sidewall. It has been observed that this sidewall implant improves the hot carrier reliability. The formation of the sidewall implant can be easily incorporated into current processes used in forming DRAM arrays. In a typically DRAM process, the semiconductor substrate is divided into array regions and support regions. Trenches are etched into the semiconductor substrate. An AA oxide may then be formed in the trench. A doped layer, preferably formed by implanting n-type dopants, is also formed in the AA sidewall.

Forming the n-type layer in AA sidewalls where NMOS-FETs are to be formed would render the NMOSFET array useless. Therefore ion implantation should be prevented in the AA sidewalls where NMOSFETs are formed. The n-type layer is preferably only implanted into the AA sidewalls of buried channel PMOSFETs formed in the support region.

Thus, after formation of the AA oxide, the array regions of the semiconductor substrate should be masked, leaving the support regions exposed. N-type ions may then be implanted into the AA sidewall in the support regions, while the array regions are protected. The doping concentration of the n-types ions implanted will depend on the doping concentration of the n-well and whether a surface channel or a buried channel device is being formed. The dose of the implant should be higher than the doping concentration of the n-well to have any effect and should extend deeper into the substrate than any buried channel depth. If a surface channel device is being formed, the depth of the implantation should not be a concern. The ion implantation forms an n-type layer in STI sidewalls in the support region of semiconductor substrate. The mask over the array region is then stripped and formation of the semiconductor device may be carried out in a conventional manner. As mentioned above, the n-type ions are preferably only implanted into the PMOSFET AA sidewall. The n-type layer reduces hot carrier induced electron injection into the trench sidewall, thus improving the hot carrier reliability.

Figure 1B:
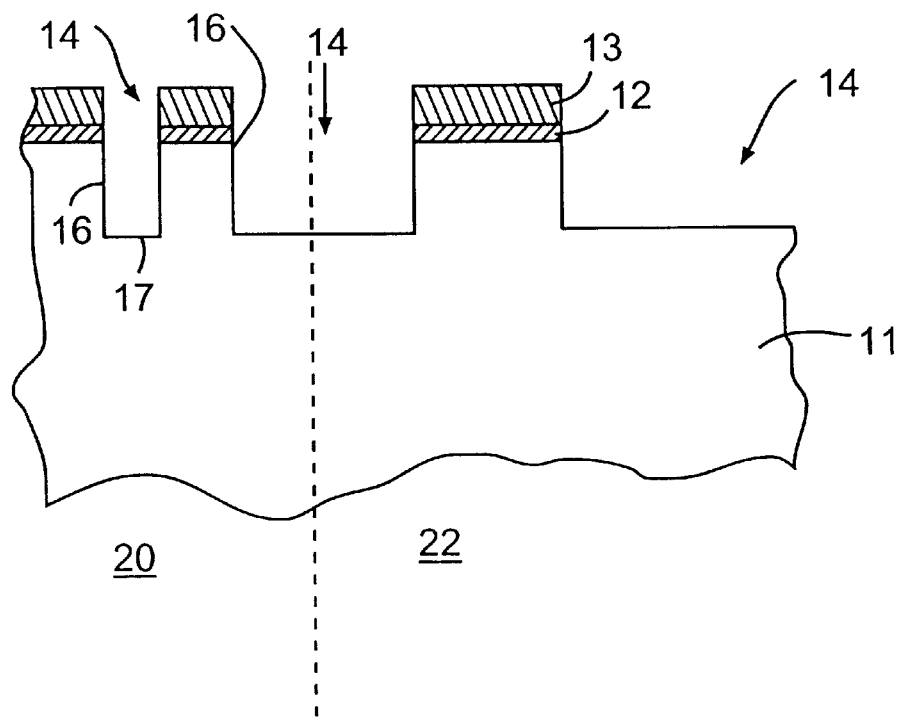
FIG. 1B shows the wafer of FIG. 1A with trenches formed therein.

Turning now to FIGS. 1A–1F, a method according to an embodiment of the present invention will now be described. A semiconductor substrate 11 is provided. Normally, a pad oxide film 12 about 3 nm to 8 nm thick is formed on the substrate 11. A pad nitride film 13 about 100 nm to 250 nm thick is usually then formed on top of the pad oxide film 12, resulting in the structure shown in FIG. 1A. Next, the pad nitride film 13, pad oxide film 12 and substrate 11 are selectively etched by a known etching process. Trenches 14 are thereby formed, as shown in FIG. 1B. The trenches 14 have sidewalls 16 and bottoms 17. When forming a DRAM, the semiconductor substrate 11 is usually divided into a plurality of array and NMOSFET regions 20 and a plurality of PMOSFET support regions 22. The arrangement of the trenches 14 is determined, in part, so that these regions 20, 22 are isolated from each other. Consequently, one of the trenches 14 will separate the array and NMOSFET region 20 from the support PMOSFET region 22 as shown in FIG. 1B. Additionally, trenches 14 define element active regions therebetween where semiconductor devices may be formed, as describe below. The above process is well known and can be carried out using conventional techniques known to one skilled in the art.

Figure 1C:
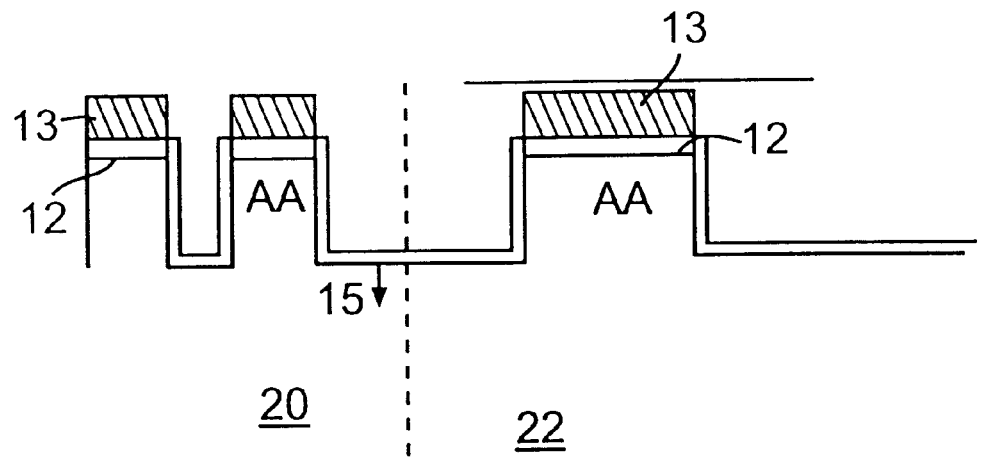
FIG. 1C shows the wafer of FIG. 1B with an oxide liner formed in the trenches.

As shown in FIG. 1C, an oxide liner 15 may be formed in a conventional manner on surfaces of the trench 14. The oxide liner 15 is typically provided to passivate the surface of the substrate 11 and is usually less than 10 nm thick. Preferably, the oxide liner 15 formed only on surfaces inside the trench 14, that is on sidewalls 16 and bottoms 17. Oxide liner 15 is also used here as a sacrificial oxide for ion implantation into the STI sidewalls 16.

Figure 1D:
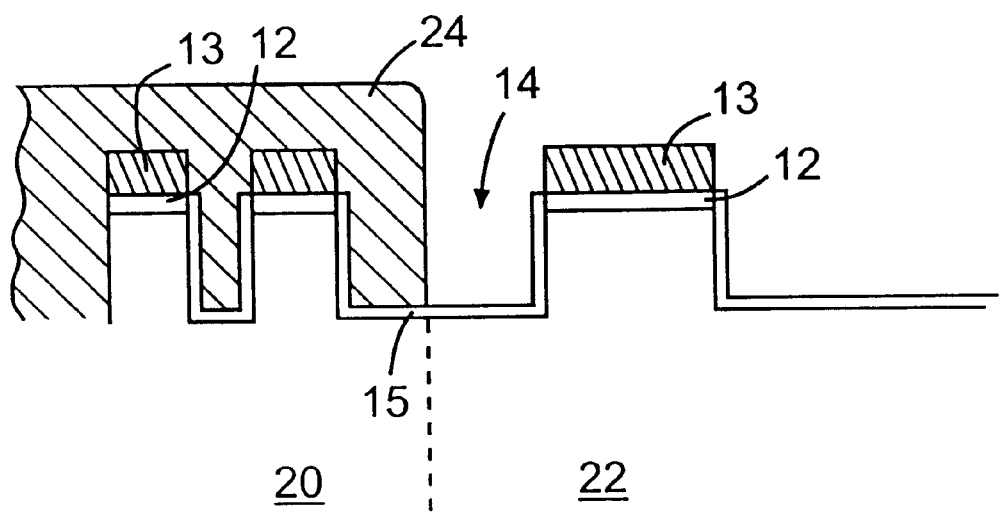
FIG. 1D shows the wafer of FIG. 1C with a mask on the NMOSFET region.
Figure 1E:
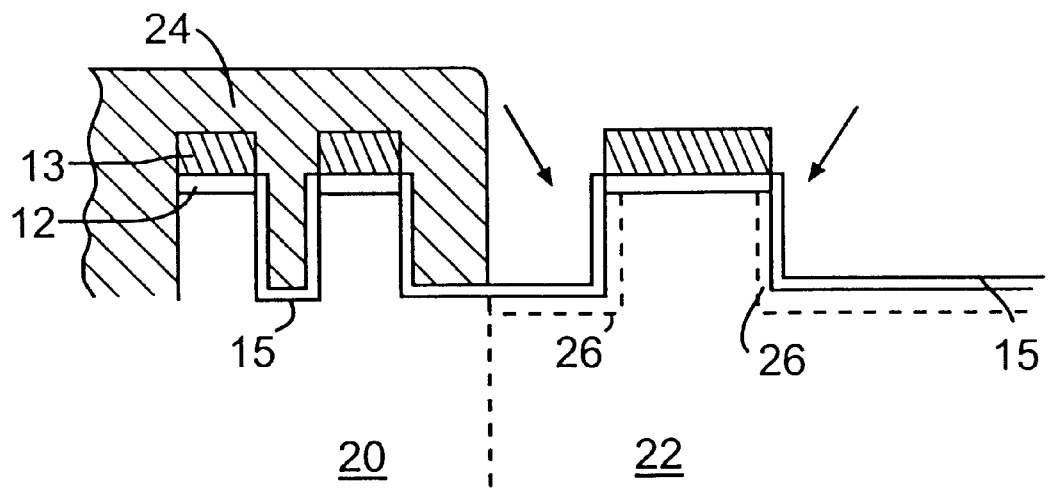
FIG. 1E illustrates implantation of ions into the wafer of FIG. 1D.
Figure 1F:
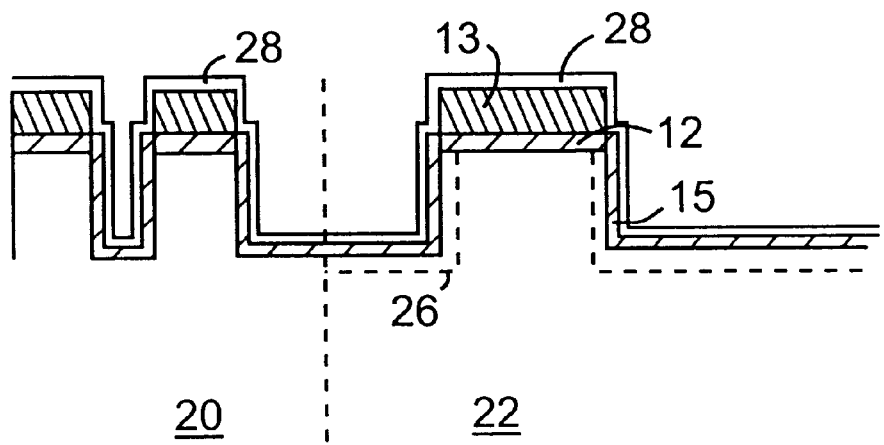
FIG. 1F illustrate the wafer of FIG. 1E with a nitride liner formed in the trench.

Next, ion implantation into the STI sidewalls is performed. The ion implantation should be carried out only in trenches in the PMOSFET support region 22. Accordingly, mask 24 may be formed over the semiconductor substrate 11, as shown in FIG. 1D. The mask 24 is preferably formed over the array region 20 and any other portion of the semiconductor substrate 11 where NMOSFETs are to be formed. The support region 22 of the substrate 11 should not be covered by mask 24 and is exposed. The mask 24 may be a layer of resist, for example, tungsten nitride. N-type ions are then implanted into the exposed surfaces of the semiconductor substrate 11. As shown in FIG. 1E, n-type ions are implanted into sidewalls 16 and bottom 17 of trenches 14. In order to have the greatest effect, the concentration of implanted ions should be highest in the STI sidewalls 16. The amount of ions implanted into the bottom 17 of the trench 14 is not of great concern. Consequently, the ion implantation should be an angled implant to direct the ions into sidewalls 16. An angled ion implant at 30 degrees with a dose of about $4-5 \times 10^{12}$ cm$^{-2}$ at an energy of 30 keV is preferred in this context. As a result of this implantation, an n-type layer 26 is formed in substrate 11. After ion implantation, the mask 24 may be stripped exposing the array region 20.

As discussed above, a nitride liner can be used in a DRAM process present in STI structures. In a preferred embodiment, a nitride liner 28 is formed after the ion implantation. The nitride liner 28 may be formed on the oxide liner 15. The nitride liner 28 is preferably a non-crystalline layer formed by LPCVD at 700°–800° C. The LPCVD process is well known to one skilled in the art. Additionally, the nitride layer 28 may be formed both inside the trench 14 and on the pad nitride layer 13, as shown if FIG. 1F. If a nitride liner is provided, the n-type layer 26 should be formed in all areas of the trench 14 where the nitride liner is to be formed.

Figure 1G:
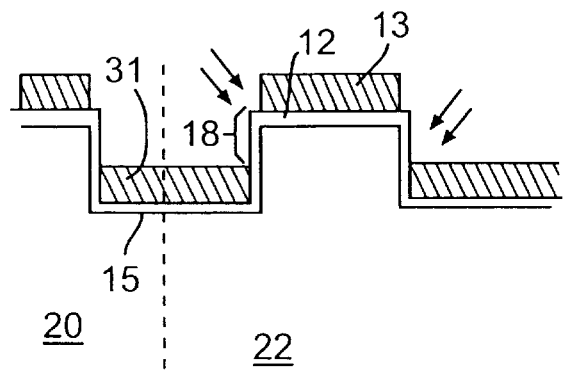
FIG. 1G shows the wafer of FIG. 1C with the trench partially filled with a dielectric.

In an additional embodiment, the trench 14 may be partially filled with a dielectric before implantation of the n-type ions into the sidewalls. In the above-described process, the trench 14 is partially filled after forming the oxide liner 15. FIG. 1G illustrates the support region 22 of FIG. 1C with the trench partially filled with oxide 31. The array region 20 is then masked with resist 24 and the ion implantation is carried out. The oxide 31 partially filling the trench 14 prevents ion implantation into the bottom 17 of the trench 14. Top parts 18 of the sidewall 16 remain exposed become doped with the n-type impurities. Thus, the ions are implanted only at the top of the sidewalls. The STI is then completely filled after the sidewall implant.

Figure 2:
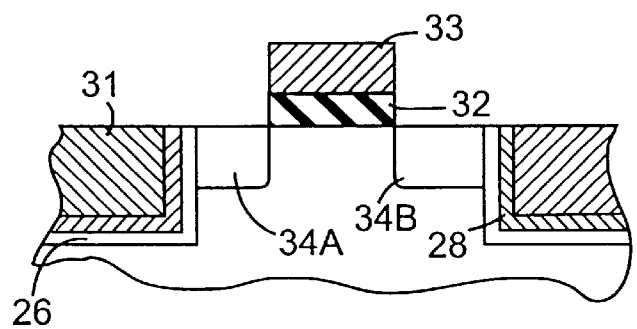
FIG. 2 shows a cross-section of a semiconductor device formed according to an embodiment of the present invention.

Formation of the DRAM may then be completed in a known manner. For example, as shown in FIG. 2, trenches 14 are filled with an oxide 31 to form isolations. Element active regions are defined on the semiconductor substrate in areas between the isolations. Source/drain regions 34 a, b are formed in substrate 11 in the element active areas and gate conductor 33 is formed on gate oxide 32 resulting in the MOSFET shown in FIG. 2.

Figure 3:
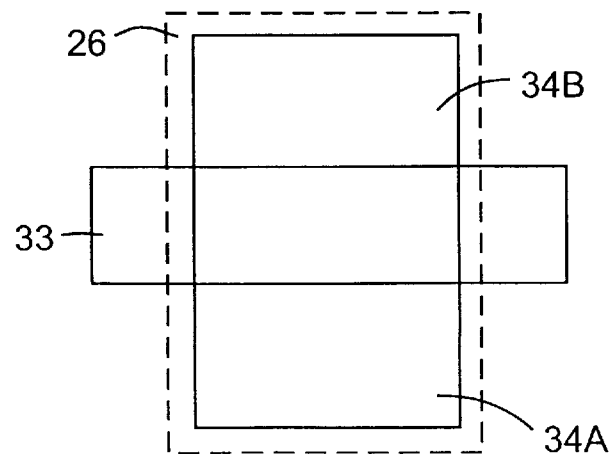
FIG. 3 shows a top view of a semiconductor device formed according to an embodiment of the present invention.

FIG. 3 is a top view of a transistor formed according to an embodiment of the invention. Source/drain regions 34 a, b are traversed by gate conductor 33. As STI regions 31 surround the transistor for isolation, n-type layer 26 is preferably formed surrounding the source/drain regions 34 a, b as shown in FIG. 3.

Consequently, a device with improved hot carrier reliability and method of forming the same is provided. N-type dopants are implanted into the PMOSFET AA sidewall. The sidewall implant improves the hot carrier reliability of buried channel PMOSFETs, even in the presence of a nitride liner. As discussed above, the invention is not limited to used in forming DRAM arrays. The invention may be used whenever NMOSFET and PMOSFET device are formed. A block mask preferably protects the NMOSFETs and n-type ions are implanted into STI sidewalls of the PMOSFETs.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of forming a semiconductor device, comprising:

forming trenches in a semiconductor substrate;

forming a mask over areas of the semiconductor substrate where NMOSFETs are to be formed;

implanting n-type dopants into sidewalls of the trenches where PMOSFETs are to be formed; and filling the trenches with a dielectric to form isolations.

2. The method of claim 1 further comprising, before the implanting step, partially filling the trench with the dielectric leaving top portions of the sidewalls exposed, whereby the n-type dopants are only implanted into the top portions of the sidewall.

3. The method of claim 1 wherein the implanting is done at an angle of about 30 degrees to the substrate.

4. A method of making a semiconductor structure, comprising:

etching trenches into a semiconductor substrate in an array region and a support region thereof;

forming an oxide liner in the trench;

implanting n-type dopant ions into at least sidewalls of the trenches in the support region, but not in the array region;

forming NMOSFETs in the array region and PMOSFETs in the support region.

5. The method of claim 4 wherein the implanting of dopants in the support region is controlled by masking the array region.

6. The method of claim 4 further comprising forming a nitride liner in the trench before depositing the oxide fill.

7. The method of claim 4 wherein the n-type dopants are implanted with a doping concentration of about $4 \times 10^{12}$ cm$^{-2}$.

8. The method of claim 4 wherein the n-type dopants are also implanted into a bottom of the trenches.

9. The method of claim 4 further comprising:

before the implanting step, partially filling the trench with a dielectric to leave top portions of the sidewalls exposed.

10. The method of claim 4 wherein the ion are implanted at an angle to the substrate.

11. The method of claim 10 wherein the angle is about 30 degrees.

12. A method of making a semiconductor structure, comprising:

dividing a semiconductor substrate into array regions and support regions;

forming trenches in the substrate;

passivating the substrate exposed in the trenches;

forming layers of n-type impurities in at least sidewalls of the trenches in the support region; and filling the trenches to form isolations.

13. The method of claim 12 wherein the isolations define element active areas therebetween.

14. The method of claim 13 further comprising forming PMOSFETs in the active areas in the support region.

15. The method of claim 12 further comprising forming a nitride liner in the trench before filling the trenches.

16. The method of claim 12 wherein the passivating step comprises forming an oxide liner on the substrate.

17. The method of claim 15 wherein the nitride liner is formed on the oxide liner.

18. The method of claim 12, wherein the layer of n-type impurities is also formed in bottoms of the trenches.

19. The method of claim 12 further comprising:

forming a resist layer over the array region prior to forming the layer of n-type impurities; and stripping the resist after forming the layer of n-type impurities.

20. The method of claim 12 wherein the trenches are filled with oxide.

21. The method of claim 12 wherein the layer of n-type impurities is formed only in top portions of the sidewalls.

22. The method of claim 12 wherein the forming step comprises performing an angled ion implant.

23. The method of claim 22 further comprising partially filling the trench with a dielectric to leave the top portions of the sidewalls exposed, before performing the angled implant.

24. The method of claim 23 wherein the angled implant is at an angle of about 30 degrees with respect to the substrate.

* * * * *